(12) United States Patent
Krasnov et al.

(10) Patent No.: US 9,156,720 B2
(45) Date of Patent: Oct. 13, 2015

(54) PATTERNED GLASS CYLINDRICAL LENS ARRAYS FOR CONCENTRATED PHOTOVOLTAIC SYSTEMS, AND/OR METHODS OF MAKING THE SAME

(71) Applicant: Guardian Industries Corp., Auburn Hills, MI (US)

(72) Inventors: Alexey Krasnov, Canton, MI (US); Willem Den Boer, Brighton, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 0 days.

(21) Appl. No.: 14/082,420

(22) Filed: Nov. 18, 2013

(65) Prior Publication Data
US 2014/0069143 A1 Mar. 13, 2014

Related U.S. Application Data

(62) Division of application No. 12/662,628, filed on Apr. 26, 2010, now Pat. No. 8,609,455.

(51) Int. Cl.
*H01L 21/00* (2006.01)
*H01L 31/0232* (2014.01)
(Continued)

(52) U.S. Cl.
CPC ............ *C03B 23/22* (2013.01); *C03B 13/08* (2013.01); *C03B 18/04* (2013.01); *C03B 18/14* (2013.01);
(Continued)

(58) Field of Classification Search
CPC ........ C03B 13/06; C03B 13/08; C03B 18/06; C03B 18/14; H01L 31/054; H01L 31/0543; H01L 31/0232; H02S 40/22; F24J 2/085; F24J 2/08; Y02E 10/43; Y02E 10/52
USPC ............... 257/184, 431, 432, 461, E31.127; 438/57, 65, 73; 136/246, 259; 126/698, 126/684, 683, 909
See application file for complete search history.

(56) References Cited

U.S. PATENT DOCUMENTS 4,002,031 A 1/1977 Bell
5,456,764 A 10/1995 Asano et al.
(Continued)

FOREIGN PATENT DOCUMENTS

FR 2 327 643 5/1977
WO WO 2005/057092 6/2005
(Continued)

OTHER PUBLICATIONS

U.S. Appl. No. 12/662,628, filed Apr. 26, 2010; Krasnov et al.
(Continued)

*Primary Examiner* — Fernando L Toledo
*Assistant Examiner* — Aaron Gray
(74) *Attorney, Agent, or Firm* — Nixon & Vanderhye P.C.

(57) ABSTRACT

Certain example embodiments of this invention relate to patterned glass that can be used as a cylindrical lens array in a concentrated photovoltaic application, and/or methods of making the same. In certain example embodiments, the lens arrays may be used in combination with strip solar cells and/or single-axis tracking systems. That is, in certain example embodiments, lenses in the lens array may be arranged so as to concentrate incident light onto respective strip solar cells, and the entire assembly may be connected to a single-axis tracking system that is programmed to follow the East-West movement of the sun. A low-iron glass may be used in connection with certain example embodiments. Such techniques may advantageously help to reduce cost per watt related, in part, to the potentially reduced amount of semiconductor material to be used for such example embodiments.

6 Claims, 5 Drawing Sheets

(51) Int. Cl.
| | |
|---|---|
| *H02N 6/00* | (2006.01) |
| *H01L 31/042* | (2014.01) |
| *H01L 31/00* | (2006.01) |
| *C03B 23/22* | (2006.01) |
| *H02S 40/22* | (2014.01) |
| *C03B 18/14* | (2006.01) |
| *F24J 2/08* | (2006.01) |
| *C03B 13/08* | (2006.01) |
| *C03B 18/04* | (2006.01) |
| *C03C 17/23* | (2006.01) |
| *H02S 40/44* | (2014.01) |
| *H01L 31/054* | (2014.01) |

(52) U.S. Cl.
CPC . *C03C 17/23* (2013.01); *F24J 2/08* (2013.01); *F24J 2/085* (2013.01); *H01L 31/0232* (2013.01); *H01L 31/0543* (2014.12); *H01L 31/0547* (2014.12); *H02S 40/22* (2014.12); *H02S 40/44* (2014.12); *Y02E 10/43* (2013.01); *Y02E 10/52* (2013.01); *Y02E 10/60* (2013.01)

(56) References Cited

U.S. PATENT DOCUMENTS

| | | | | |
|---|---|---|---|---|
| 5,615,048 | A | * | 3/1997 | Davies et al. ................. 359/622 |
| 5,656,209 | A | * | 8/1997 | Benz et al. ..................... 264/1.6 |
| 6,123,824 | A | | 9/2000 | Sano et al. |
| 6,288,325 | B1 | | 9/2001 | Jansen et al. |
| 6,613,603 | B1 | | 9/2003 | Sano |
| 6,784,361 | B2 | | 8/2004 | Carlson et al. |
| 8,609,455 | B2 | | 12/2013 | Krasnov et al. |
| 2001/0023971 | A1 | | 9/2001 | Kondo et al. |
| 2003/0183270 | A1 | | 10/2003 | Falk et al. |
| 2005/0081908 | A1 | | 4/2005 | Stewart |
| 2006/0169316 | A1 | | 8/2006 | Thompsen et al. |
| 2006/0249199 | A1 | | 11/2006 | Thompsen et al. |
| 2007/0209698 | A1 | | 9/2007 | Thomsen et al. |
| 2007/0215205 | A1 | | 9/2007 | Thompsen et al. |
| 2007/0291373 | A1 | * | 12/2007 | Hu et al. ...................... 359/641 |
| 2008/0289689 | A1 | | 11/2008 | Gibson |
| 2009/0038343 | A1 | * | 2/2009 | Gibson ........................ 65/60.1 |
| 2009/0068474 | A1 | | 3/2009 | Lower et al. |
| 2009/0217978 | A1 | | 9/2009 | Thompsen et al. |
| 2009/0223252 | A1 | | 9/2009 | Fulton et al. |
| 2009/0277496 | A1 | | 11/2009 | Khazeni et al. |

FOREIGN PATENT DOCUMENTS

| | | |
|---|---|---|
| WO | WO 2009/020778 | 2/2009 |
| WO | WO 2009/137816 | 11/2009 |
| WO | WO 2010/010530 | 1/2010 |

OTHER PUBLICATIONS

U.S. Appl. No. 12/662,624, filed Apr. 26, 2010; Krasnov et al.
International Search Report mailed Aug. 30, 2011.
U.S. Appl. No. 12/292,346, Fulton et al., filed Nov. 17, 2008.
U.S. Appl. No. 12/385,318, Fulton et al., filed Apr. 3, 2009.

* cited by examiner

PATTERNED GLASS CYLINDRICAL LENS ARRAYS FOR CONCENTRATED PHOTOVOLTAIC SYSTEMS, AND/OR METHODS OF MAKING THE SAME

This application is a division of application Ser. No. 12/662,628, filed Apr. 26, 2010, the entire disclosure of which is hereby incorporated herein by reference in this application.

FIELD OF THE INVENTION

Certain example embodiments of this invention relate to improved solar photovoltaic systems, and/or methods of making the same. More particularly, certain example embodiments of this invention relate to patterned glass that can be used as a cylindrical lens array in a concentrated photovoltaic application, and/or methods of making the same. In certain example embodiments, the lens arrays may be used in combination with strip solar cells and/or single-axis tracking systems. Such techniques may advantageously help to reduce cost per watt related, in part, to the potentially reduced amount of semiconductor material to be used for such example embodiments.

BACKGROUND AND SUMMARY OF EXAMPLE EMBODIMENTS OF THE INVENTION

Photovoltaic devices are known in the art (e.g., see U.S. Pat. Nos. 6,784,361, 6,288,325, 6,613,603, and 6,123,824, the disclosures of which are hereby incorporated herein by reference). Some conventional mainstream photovoltaic modules use a large number of crystalline silicon (c-Si) wafers. The inclusion of the large number of c-Si wafers tends to dominate the cost of the overall photovoltaic module. Indeed, about 60% of the costs involved in the production of conventional photovoltaic modules is related to the c-Si solar cells. To address this issue, concentrated photovoltaic (CPV) systems have been proposed, in which the sunlight is to be focused with concentration ratios of 100× to 1000×. Calculations suggest that a concentration ratio of approximately 10× should enable a photovoltaic system to be produced that uses at least 90% less silicon material.

Unfortunately, however, current concentrated photovoltaic systems are expensive high efficiency multi-junction solar cells, expensive dual-axis tracking systems, and/or relatively expensive concentrating optics. Therefore, these systems have difficulty competing with other photovoltaic solutions on a cost per watt basis.

Thus, it will be appreciated there is a need in the art for a simple low-cost CPV systems, together with low cost solar cells and low-cost concentrating optics, and/or methods of making the same.

One aspect of certain example embodiments relates to a patterned glass cylindrical lens array, and/or methods of making the same.

Another aspect of certain example embodiments relates to using such a cylindrical lens array to focus light on substantially elongate or strip solar cells.

Another aspect of certain example embodiments relates to one-axis tracking systems, and/or methods of making and/or using the same.

In certain example embodiments of this invention, a method of making a lens array for use in a solar photovoltaic module is provided. Glass is made using a float process including a float glass line. The glass is patterned using a plurality of rollers disposed along the float glass line so as to form a plurality of first lenses oriented along a common axis. The rollers each have profiles such that each said first lens is patterned to have at least one convex major surface when viewed in side cross section.

In certain example embodiments of this invention, a method of making a solar photovoltaic module is provided. A lens array comprising a plurality of lenses oriented along a common axis is provided, with the lenses being patterned using rollers disposed along a float glass line, and with the lenses each having at least one convex major surface when viewed in side cross section. A plurality of elongate solar cells is provided, with each said solar cell comprising c-Si. The lens array is oriented relative to the solar cells such that each said lens is arranged to concentrate light incident thereon in substantially one dimension on the elongate solar cells. In certain example instances, a solar photovoltaic module is made in this way, and the photovoltaic module is connected to a single-axis tracking system at a fixed tilt, with the single-axis tracking system being movable so as to match the East-West movement of the sun.

In certain example embodiments of this invention, a method of making a solar photovoltaic system is provided. At least one lens array comprising a plurality of lenses oriented along a common axis is provided, with the lenses being patterned using rollers disposed along a float glass line, and with the lenses each having at least one convex major surface when viewed in side cross section. The at least one lens array is oriented relative to a plurality of elongate solar cells comprising c-Si such that each said lens is arranged to concentrate light incident thereon in substantially one dimension on the elongate solar cells. The at least one lens array and the plurality of elongate solar cells are built into a single-axis tracking system that is movable so as to match the East-West movement of the sun.

In certain example embodiments of this invention, a method of making a solar photovoltaic system is provided. At least one lens array comprising a plurality of lenses oriented along a common axis is provided, with the lenses being patterned using rollers disposed along a float glass line, and with the lenses each having at least one convex major surface when viewed in side cross section. Tubing is provided on a non-light incident side of the at least one lens array, with the tubing being suitable to convey liquid therethrough and having at least one elongate solar cell comprising c-Si disposed thereon proximate to or over a liquid input location. The at least one lens array is oriented relative to the tubing each said lens is arranged to concentrate light incident thereon in substantially one dimension on the tubing such that, in operation, electricity is generated via the at least one elongate solar cell and such that the liquid is heated from an initial temperature at the liquid input location to an elevated temperature as the liquid moves through the tubing to a liquid output location.

In certain example embodiments of this invention, a photovoltaic system is provided. A plurality of elongate solar cells is provided, with each said solar cell comprising c-Si. A lens array comprising a plurality of lenses oriented along a common axis is provided, with each said lens being configured to concentrate incident light in substantially one dimension the elongate solar cells, and with each said lens having a concentration ratio of 3×-30×.

In certain example embodiments of this invention, a photovoltaic system is provided. A plurality of elongate solar cells is provided. A lens array comprising a plurality of lenses oriented along a common axis is provided, with each said lens being configured to concentrate incident light in substantially one dimension on the elongate solar cells. A single-axis tracking system is provided, with the single-axis tracking system being configured to move the lens array and/or the plurality of elongate solar cells so as to substantially match the East-West movement of the sun. Each said lens has a convex top and/or bottom surface when viewed in side cross section. The lens array is patterned from a single low-iron glass substrate.

In certain example embodiments of this invention, a photovoltaic system is provided. At least one lens array comprising a plurality of lenses oriented along a common axis is provided, with the lenses being patterned from low iron float glass along a float glass line, and with the lenses each having at least one convex major surface when viewed in side cross section. Tubing is provided on a non-light incident side of the at least one lens array, with the tubing being suitable to convey liquid therethrough and having at least one elongate solar cell comprising c-Si disposed thereon proximate to or over a liquid input location. The at least one lens array is oriented relative to the tubing such that each said lens is arranged to concentrate light incident thereon in substantially one dimension on the tubing to generate electricity via the at least one elongate solar cell and to heat the liquid from an initial temperature at the liquid input location to an elevated temperature as the liquid moves through the tubing to a liquid output location.

In certain example embodiments of this invention, a building product is provided. A plurality of elongate solar cells comprising c-Si is supported by a cover glass substrate. A lens array comprises a plurality of lenses oriented along a common axis, with each said lens being configured to concentrate incident light in substantially one dimension on the elongate solar cells, and with the lens array being substantially parallel to and spaced apart from the cover glass substrate. Each said lens has a convex top and/or bottom surface when viewed in side cross section. The lens array is patterned from a single low-iron glass substrate. In certain example instances, a frame may be structured to maintain the lens array and the cover glass substrate in parallel spaced apart relation.

In certain example embodiments of this invention, a method of making a solar photovoltaic module is provided. An array comprising a plurality of reflective elements oriented along a common axis is provided, with the array being patterned using rollers disposed along a float glass line, and with the reflective elements each having a concave major surface when viewed in side cross section. A plurality of elongate solar cells is provided on a glass substrate, with each said solar cell comprising c-Si. The array is oriented relative to the substrate such that each said reflective element is arranged to concentrate light incident thereon in substantially one dimension on the elongate solar cells.

In certain example embodiments of this invention, a solar photovoltaic module is provided. An array comprises a plurality of reflective elements oriented along a common axis, with the array being patterned from low iron float glass, and with the reflective elements each having at least one concave major surface when viewed in side cross section. A plurality of elongate solar cells is provided on a glass substrate, with each said solar cell comprising c-Si. The array is oriented relative to the substrate such that each said reflective element is arranged to concentrate light incident thereon in substantially one dimension on the elongate solar cells.

The features, aspects, advantages, and example embodiments described herein may be combined to realize yet further embodiments.

BRIEF DESCRIPTION OF THE DRAWINGS

These and other features and advantages may be better and more completely understood by reference to the following detailed description of exemplary illustrative embodiments in conjunction with the drawings, of which.

DETAILED DESCRIPTION OF EXAMPLE EMBODIMENTS OF THE INVENTION

Photovoltaic devices such as solar cells convert solar radiation into usable electrical energy. The energy conversion occurs typically as the result of the photovoltaic effect. Solar radiation (e.g., sunlight) impinging on a photovoltaic device and absorbed by an active region of semiconductor material generates electron-hole pairs in the active region.

Certain example embodiments of this invention relate to patterned glass that can be used as a cylindrical lens array in a concentrated photovoltaic application, and/or methods of making the same. In certain example embodiments, the lens arrays may be used in combination with strip solar cells and/or single-axis tracking systems. That is, in certain example embodiments, lenses in the lens array may be arranged so as to concentrate incident light onto respective strip solar cells, and the entire assembly may be connected to a single-axis tracking system that is programmed to follow the East-West movement of the sun. A low-iron glass may be used in connection with certain example embodiments. Such techniques may advantageously help to reduce cost per watt related, in part, to the potentially reduced amount of semiconductor material to be used for such example embodiments.

Figure 1:
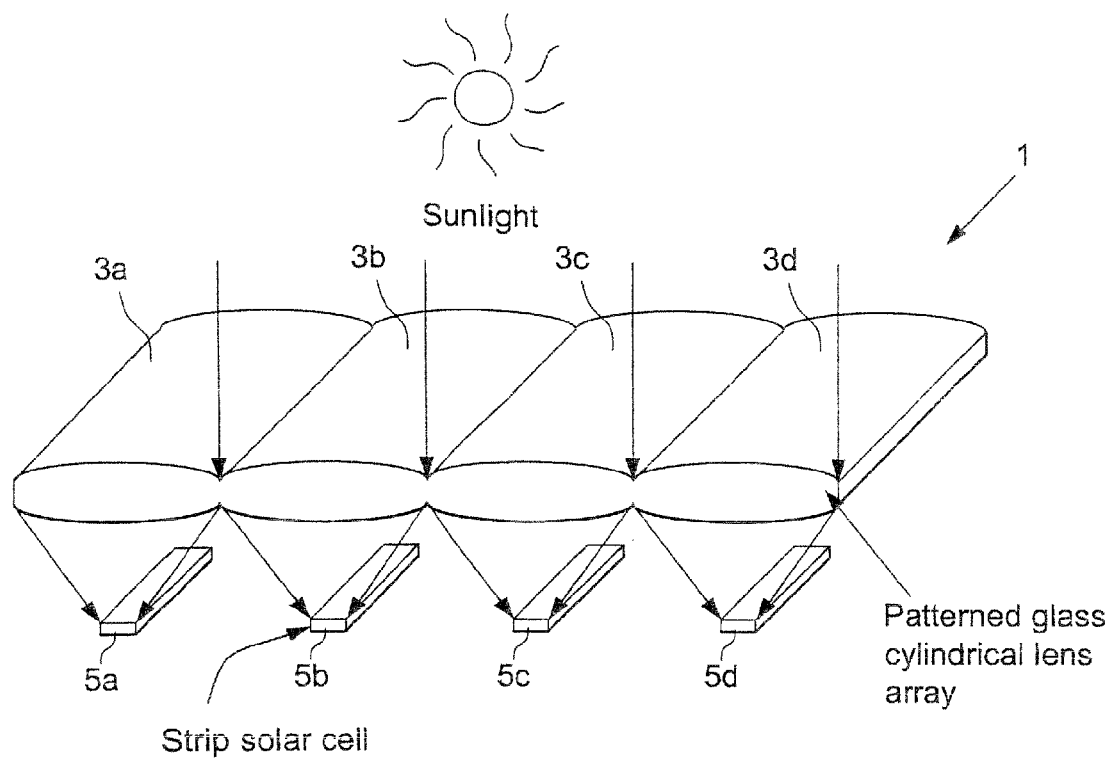
FIG. 1 is an illustrative linear focusing concentrating photovoltaic system including a cylindrical lens array made from patterned glass according to an example embodiment.

As indicated above, certain example embodiments relate to patterned glass cylindrical lens arrays, and/or methods of making the same. In this regard, FIG. 1 is an illustrative linear focusing concentrating photovoltaic system including a substantially cylindrical lens array made from patterned glass according to an example embodiment. A large flat low iron glass plate is modified into a lens array 1 by periodically modifying its thickness, e.g., at regular intervals. The lenses $3a$-$3d$ in the lens array 1 focus the sunlight from the sun in substantially one dimension, with a concentration ratio of, for example, 3× to 30×. The solar radiation may be focused on, for example, c-Si solar cells, with an efficiency of up to 20%. Such c-Si solar cells are commercially available at reasonable costs. FIG. 1 shows the c-Si solar cells being formed as strips 5a-5d. Further details regarding these strip solar cells 5a-5d are provided below. In any event, the c-Si solar cells may be provided on one or more opaque or transparent substrates in different embodiments of this invention. The lenses 3a-3d in the lens array 1 are provided substantially in-line along a common axis. The lenses 3a-3d may be formed from a single piece of glass in certain example embodiments. In such cases, the lenses 3a-3d may effectively be connected to one another by virtue of being formed from a common glass substrate. Alternatively or in addition, multiple lenses and/or lens arrays may be provided adjacent to one another in different example embodiments of this invention.

Figure 2:
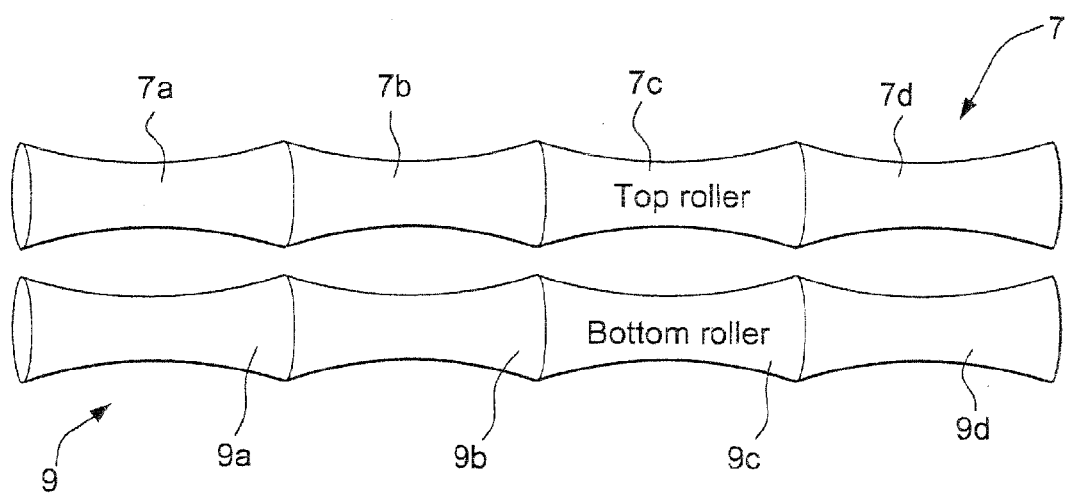
FIG. 2 is a schematic view of illustrative top and bottom roller profiles that may be used in a patterning line to obtain the lens array of certain example embodiments.

A patterning line in a float glass factory may be used to create the large area cylindrical lens array of certain example embodiments. This can be done by using one or more sets of top and bottom rollers with the example profile shown in FIG. 2. That is, FIG. 2 is a schematic view of illustrative top and bottom roller profiles that may be used in a patterning line to obtain the lens array of certain example embodiments. When viewed in cross-section, the individual top and bottom rollers 7a-7d and 9a-9d in the top and bottom roller arrays 7 and 9 are concave at the top and bottom. Thus, the rollers of FIG. 2 will lead to a convex-convex lens array. Of course, it will be appreciated that a plano-convex lens array may be obtained, as well, when either the top of bottom set of rollers is flat.

Figure 3:
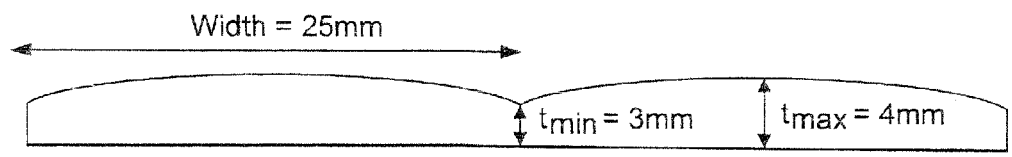
FIG. 3 shows example dimensions of lenses in a lens array in accordance with an example embodiment.

FIG. 3 shows example dimensions of lenses in a lens array in accordance with an example embodiment. Each lens in the FIG. 3 example has a pitch or width that ranges from approximately 10-100 mm, a minimum thickness or height from about 2-4 mm, and a maximum thickness or height of about 4-8 mm. Depending on the pitch, the focal length will be about 10-200 mm, e.g., from or proximate to the center of the individual lenses. Of course, it will be appreciated that the dimensions specified in FIG. 3 are provided by way of example. Indeed, different embodiments of this invention may include differently sized, shaped, and/or focal length lenses. For instance, the minimum thickness or height of certain example embodiments may be about 2 mm and the maximum thickness or height of certain example embodiments may be about 8 mm. In certain example embodiments, a 1 $m^2$ module may comprise about 10-50 lenses. The FIG. 3 example has a width of 25 mm, a minimum thickness of 3 mm, and a maximum thickness of 4 mm. These dimensions imply a height difference of 1 mm and 40 lenses per 1 $m^2$ module. In example instances, the focal length will be 150 mm, and the lens-solar cell distance may be placed at 135 mm to achieve a concentration ratio of about 10. Placing the solar cell closer to the focal point may be advantageous in certain example instances so that light is concentrated on a larger area of the solar cell.

Any suitable transparent substrate may be used in connection with certain example embodiments of this invention. For instance, certain example embodiments may incorporate a low-iron glass substrate, e.g., to help ensure that as much red and near-IR light as possible is transferred to the semiconductor absorber layer. Example low-iron glass substrates are disclosed, for example, in co-pending and commonly assigned application Ser. Nos. 11/049,292; 11/122,218; 11/373,490; 12/073,562; 12/292,346; 12/385,318; and 12/453,275, the entire contents of each of which are hereby incorporated herein by reference.

For instance, certain example embodiments may incorporate a high transmission low iron glass, which is highly oxidized and made using the float process. In certain example embodiments, the glass composition used for the glass is made via the float process using an extremely high and positive batch redox in order to reduce % FeO to a low level and permit the glass to consistently realize a combination of high visible transmission (Lta or Tvis), high infrared (IR) transmission, and high total solar (TS) transmission. Further details of example low iron glass are provided below.

In addition, the low iron glass may be thermally tempered. Such tempering may occur in certain example embodiments at the end of the production line, e.g., after the glass has been patterned in certain example instances.

Current CPV systems typically implement two-axis tracking because they use two-dimensional focusing. In this regard, current CPV systems usually are mounted on poles with individual tracking for each unit system. This arrangement increases the cost of the system. By contrast, certain example embodiments that implement cylindrical lens arrays reduce (and sometimes completely eliminate) the need for dual-axis tracking. This is because the cylindrical lens arrays of certain example embodiments are configured to linearly focus sunlight on or along a strip as opposed to a smaller point or spot location. Indeed, when the cylindrical lenses of certain example embodiments are oriented substantially vertically, simple East-West one-axis tracking may be implemented easily and efficiently.

In Table 1 the annual energy outputs from a 20% efficient system at an example location (Phoenix, Ariz.) are compared for fixed latitude tilt, one-axis tracking, and two-axis tracking systems. More particularly, the solar cells are high efficiency, back contact solar cell strips commercially available from Sunpower. The improvement in energy output going from a fixed orientation system to a one-axis tracking system is 30.7%. This is a very significant gain. However, the improvement of moving from a one-axis tracking system to a dual-axis tracking system is only an additional 5.8%. This additional 5.8% energy gain typically is offset by the expense of the dual-axis tracking system itself. Current dual-axis tracking systems therefore are not seen as economical. In any event, certain example embodiments that implement a linearly focused system are able to realize at least the efficiency gains associated with moving from a single-axis tracking system to dual-axis tracking system without actually having to incur the expenses associated with the dual-axis tracking system because such embodiments may be implemented with only one-axis tracking systems.

TABLE 1

Annual energy output per $m^2$ incident sunlight for fixed orientation, one-axis tracking, and two-axis tracking systems in Phoenix (based on NREL PVWatts Calculator)

| | | | Annual energy generation (kWh/$m^2$/yr) | | |
| --- | --- | --- | --- | --- | --- |
| | PV technology | Conversion Efficiency | Fixed orientation (On roof) Lat. tilt | One-axis E-W tracking | Two-axis tracking |
| Phoenix | High eff. c-Si | 20% | 386.53 | 505.52 | 534.80 |
| 33° 43° N | | | ~100% | ~131% | ~138% |

It will be appreciated that certain example embodiments are advantageous for a number of reasons. For instance, single-axis tracking can be implemented at low cost, because many modules can be oriented with a single actuator by connecting all modules to each other through parallel beams. The lens array is oriented substantially vertically and is therefore largely self-cleaning, as rain will flow down in the grooves of the patterned glass and reduce the amount of dust accumulation. Additional periodic cleaning optionally may be implemented, of course. Single-axis tracking systems also may be low to the ground, as the mechanisms for moving it are simplified compared to the mechanisms used for two-axis tracking systems.

The solar cells in the FIG. 1 example system may be manufactured economically, e.g., by cleaving strips from c-Si solar cells. For instance, a larger (e.g., 4 inch to 12 inch) wafer may be formed and subsequently cleaved to produce a plurality of strips. For concentration ratios of 3× to 30×, only about 33% to 3.3% silicon is needed, as compared to conventional c-Si modules without concentration which may require higher amounts of silicon.

As alluded to above and as suggested in the use of the term "strip" itself, the strip solar cells of certain example embodiments may have a substantially elongated shape. For instance, certain example strip solar cells may be 2 mm×150 mm, although other dimensions also are possible. In any event, the strip solar cells may be cleaved along the direction of its crystal orientation. The strip cells optionally may be mounted on a second glass substrate or another type of substrate in certain example embodiments. In so doing, the second substrate may be made to function as a heat sink, thereby helping to keep the operating temperature of the solar cells low and their efficiency high. Active cooling may be used in place of, or in addition to, such heat sink techniques in certain example embodiments.

In connection with example embodiments that implement strip solar cells, low-cost assembly techniques known and commonly used in, for example, the flat panel display (FPD) industry, may be used. For example, such techniques may readily be used in connection with strip solar cells having a width of 2-20 mm, and such techniques may include, for example, chip on glass (COG) manufacturing. These COG manufacturing techniques may, in turn, incorporate interconnecting wires such as, for example, patterned metals provided on the glass, copper tape, and/or the like. Certain example embodiments may incorporate solar cells with low shading or non-shading interconnects. Non-shading interconnects sometimes are used, for example, in back contact solar cells (e.g., available from Sunpower).

Figure 4:
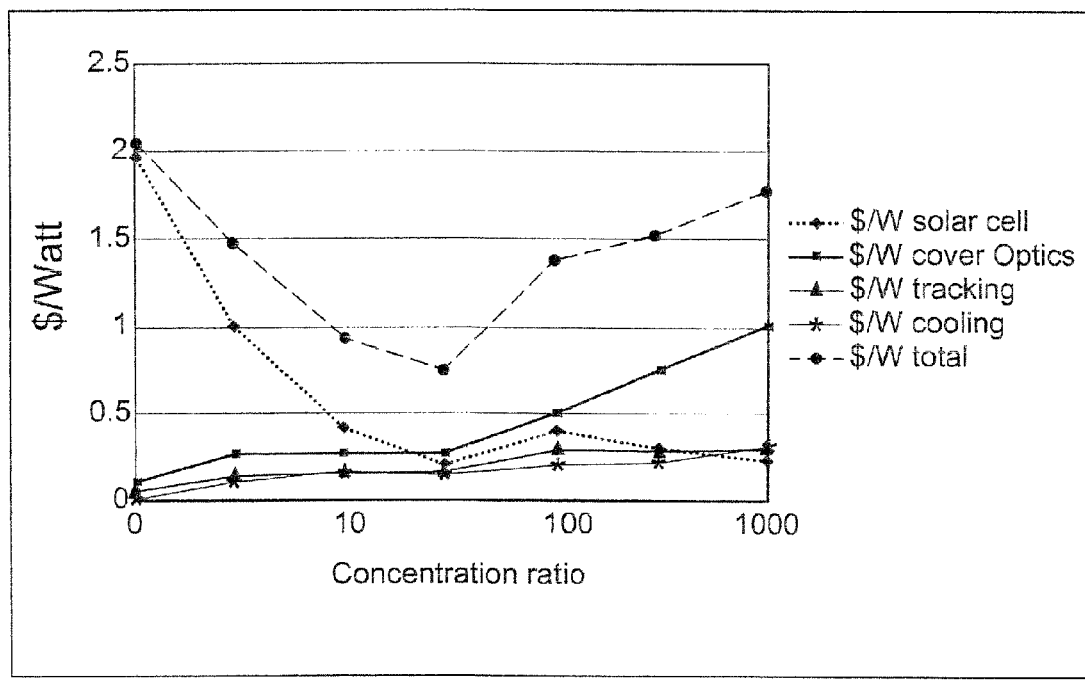
FIG. 4 is a graph showing the approximate cost per watt vs. concentration ratio (CR) of various different concentrating photovoltaic systems.

FIG. 4 is a graph showing the approximate cost per watt vs. concentration ratio (CR) of various different concentrating photovoltaic systems. The FIG. 4 graph is based on the following assumptions. For CRs greater than 100, expensive multi-junction GaAs cells need to be used with active cooling. For CRs greater than 100, two-dimensional concentration is needed with dual-axis tracking. For CR less than 100, one-dimensional (e.g., cylindrical) concentration is used along with single-axis tracking. The cost per watt for the solar cell includes costs associated with packaging and interconnects, and the cost per watt for the concentrating optics includes costs associated with alignment. The FIG. 4 graph allows efficiency to exceed 20%. As will be appreciated from the FIG. 4 graph, a concentration ratio of about 10-30× is particularly desirable from a cost per watt perspective.

It will be appreciated that there are a number of advantages associated with certain example embodiments of this invention. For example, the 3× to 30× concentration optics may be produced easily and inexpensively using patterned glass. This may, in turn, also allow for a 3× to 30× smaller area of c-Si solar cells. Cylindrical lens arrays may be substantially self-cleaning when installed vertically at a latitude tilt in certain example implementations, as the amount of dust and/or other debris that will accumulate will be reduced, since rain will clean the grooves of the vertically positioned patterned glass lens array. Certain example embodiments also enable low cost and known, reliable assembly techniques from the FPD industry to be used in connection with strip solar cells (e.g., when they are provided with a width of about 2-20 mm). Also, as explained in detail above, the use of low-cost single-axis tracking systems may in certain example embodiments advantageously improve power output by about 30% as compared to fixed orientation systems. Furthermore, many modules may be easily connected to the same single-axis tracking system. The use of such example techniques in high direct-insolation areas such as the Southwest USA may lead to higher annual energy output.

Figure 5:
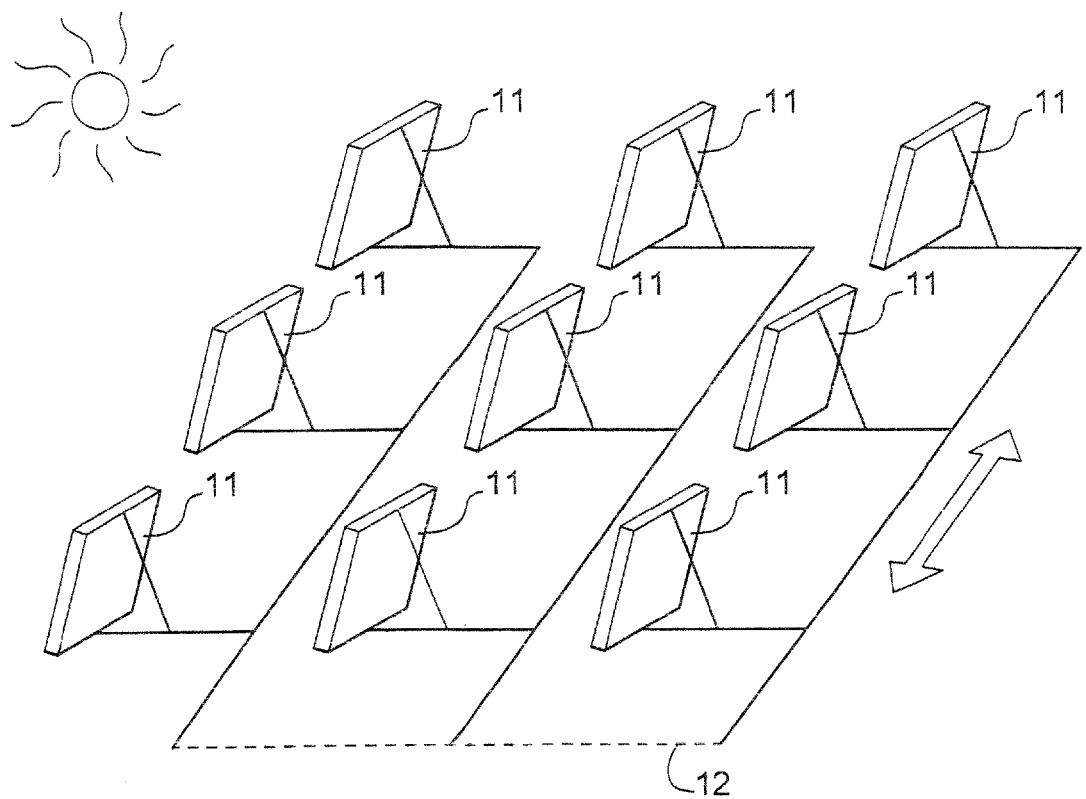
FIG. 5 is a schematic view of an illustrative one-axis tracking system incorporating concentrating lens arrays in accordance with an example embodiment.

FIG. 5 is a schematic view of an illustrative one-axis tracking system incorporating concentrating lens arrays in accordance with an example embodiment. The illustrative system in FIG. 5 includes a plurality of concentrating lens array modules 11. Each such module 11 may be the same as or similar to the arrangement shown in FIG. 1, for example. That is, each module may include a lens array that concentrates light on strip solar cells, e.g., of c-Si. The individual modules 11 may be connected to a common power source, e.g., using interconnects 12. The modules 11 also may be controlled such that they move in a direction that matches the East-West movement of the sun.

In certain example embodiments, antireflective (AR) coatings may be provided to one or both sides of the lens array to increase transmission. In certain example embodiments, a broadband AR may be provided using any suitable technique. In certain example instances, a low index silicon oxide (e.g., $SiO_2$ or other suitable stoichiometry) coating having an index of refraction of about 1.3 may be provided on one or both sides of a lens array through a wet application process (e.g., a dip, spray, roll, or other coating process), for a sol, for example. Such a technique may lead to for example, a 3-6% increase in lens array transmission and/or module power, depending on the coating used and the number of surfaces coated.

In certain example embodiments, the lens array may be heat strengthened and/or thermally tempered. Of course, thermal tempering may be difficult to accomplish in connection with patterned glass having varying thicknesses. Chemical tempering and/or strengthening techniques therefore may be used in connection with certain example embodiments.

Figure 6:
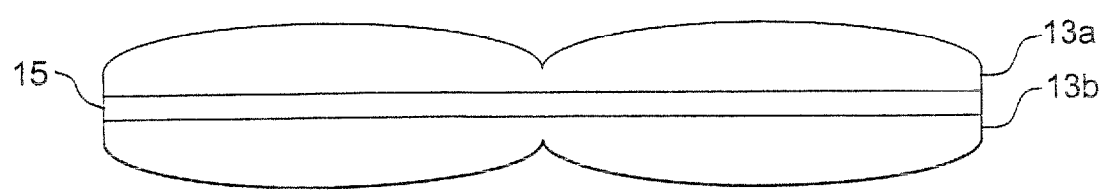
FIG. 6 is a schematic view of two plano-convex arrays being laminated together in accordance with an example embodiment.

As another alternative or addition, lens arrays may be laminated together, e.g., as shown in FIG. 6, which is a schematic view of two plano-convex arrays being laminated together in accordance with an example embodiment. In FIG. 6, first and second plano-convex arrays 13a and 13b are provided. The first and second plano-convex arrays 13a and 13b are laminated together using any suitable laminate material 15. For instance, PVB, EVA, or the like may be used to laminate together the first and second plano-convex arrays 13a and 13b. The individual arrays 13 may be individually strengthened or tempered (thermally, chemically, or otherwise) in certain example instances, as the variations in thickness may be less severe and thus easier to process in comparison to convex-convex type lens arrays. In certain example instances, the laminate 15 itself may help to strengthen the overall array.

Figure 7:
FIG. 7 is a schematic view of a Fresnel-type lens array in accordance with an example embodiment.

FIG. 7 is a schematic view of a Fresnel-type lens array in accordance with an example embodiment. As is known, Fresnel lenses generally have large apertures and short focal lengths, without the weight and volume of material that would be required in conventional lens design. In addition, Fresnel lenses tend to be thinner, thereby allowing more light to pass through them. The comparatively lower thickness variation may enable Fresnel lenses to be tempered. Although the example lens in FIG. 7 is patterned on both major axes, it will be appreciated that one side of the lens may be planar or substantially planar and the other side may be patterned. In certain example embodiments, such lenses having one planar side and one Fresnel patterned side may be laminated together, e.g., using the techniques and/or materials described above.

Figure 8:
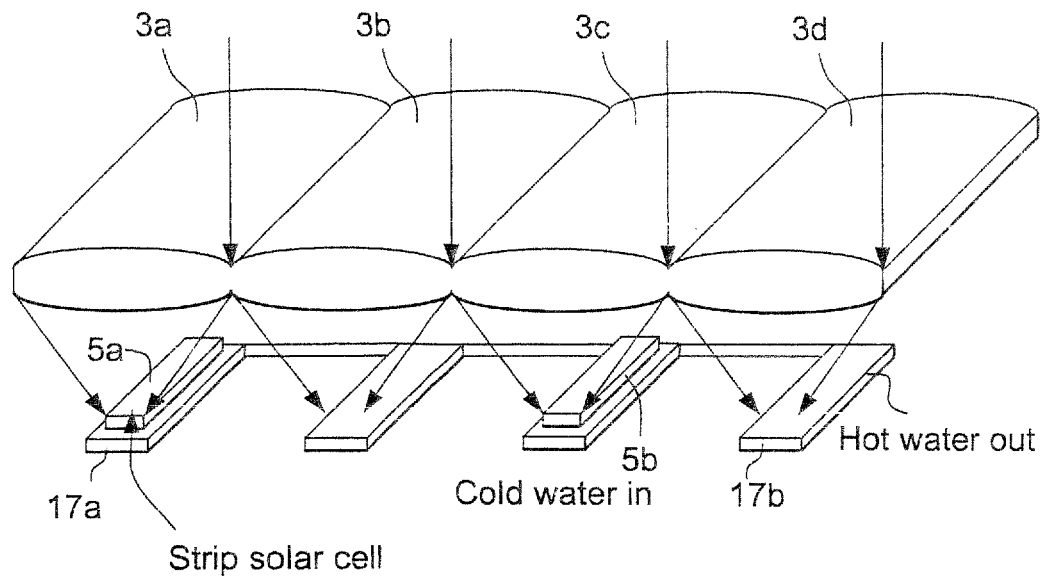
FIG. 8 is a hybrid thermal solar panel system that incorporates a lens array and strip solar cells in accordance with an example embodiment.

FIG. 8 is a hybrid thermal solar panel system that incorporates a lens array and strip solar cells in accordance with an example embodiment. The FIG. 8 example system is similar to the FIG. 1 example system in that it includes a lens array having a plurality of lenses 3a-3d, and a plurality of strip solar cells 5a-5b. Light from the sun is focused on the strip solar cells 5a-5b to produce electricity. The FIG. 5 example hybrid system also includes tubing 17a and 17b through which water or another suitable fluid may flow. Cool water is fed into the tubing 17a and 17b proximate to the strip solar cells 5a-5b, continues in a path (which in the FIG. 8 example embodiment is substantially U-shaped), and exits remote from the strip solar cell. Providing cool water proximate to the strip solar cells is advantageous in that it improves the efficiency of the c-Si. In this regard, it is known that the efficiency of c-Si solar cells drops significantly at higher temperatures (e.g., at 60 degrees C.) and improves at lower temperatures (e.g., at 25 degrees C.). The provision of cooler water proximate to the strip solar cells therefore may improve the operational efficiency of the system.

Although the presence of cooling water may increase efficiency of an individual strip solar cell, the overall solar cell efficiency may be decreased by providing fewer total solar cells, e.g., because a solar cell may not be provided along the return path for the hot output water. Nevertheless, overall efficiency may be improved by virtue of the cooling water's effect on the strip solar cells that are present and the further heating of the water via the lens array throughout the entire path, including the return path (where there is no solar cell). The heated water, of course, may be used as it otherwise would be used in connection with a thermal solar power application. As explained in greater detail below, the lens array and/or the tubing may move relative to one another, e.g., so as to match the East-West movement of the sun. This may be advantageous, for example, in building-integrated photovoltaic (BIPV) applications.

Figure 9:
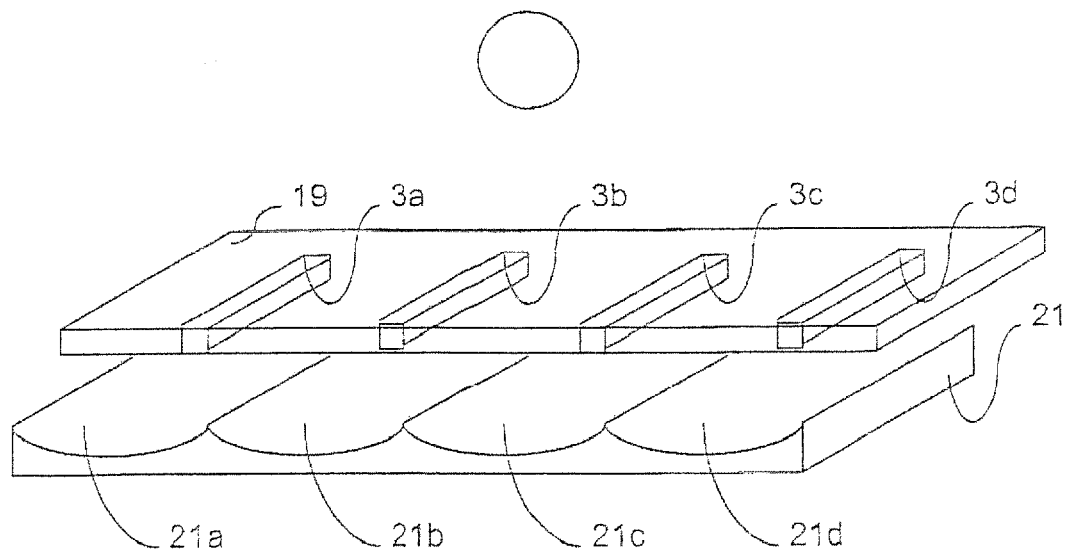
FIG. 9 is an illustrative system that incorporates a patterned mirror array and strip solar cells in accordance with an example embodiment.

Focusing additionally or alternatively may be performed using a patterned mirror array. FIG. 9 is an illustrative system that incorporates a patterned mirror array and strip solar cells in accordance with an example embodiment. In FIG. 9, strip solar cells 3a-3d are provided, directly or indirectly, on a cover glass substrate 19. For instance, the cover glass substrate 19 may be closer to the sun, and the strip solar cells 3a-3d in certain example instances may be provided on a major surface of the cover glass substrate 19 opposite the sun. In certain example embodiments, the cover glass substrate may be made from low iron float, glass. In certain example embodiments, an AR coating may be applied thereto. Light passing through the cover glass substrate 19 may be reflected and concentrated back towards the strip solar cells 3a-3d using a mirror array 21. The mirror array 21 may be a piece (or multiple pieces) of patterned glass that has been coated with a reflective coating. Light impinging on the troughs or concave areas 21a-21d in the mirror array 21 therefore may be reflected back towards the strip solar cells 3a-3d. As above, relative movement of one or both of the cover glass substrate 19 and the mirror array 21 may be caused so as to improve efficiency (e.g., by tracking the East-West movement of the sun).

Although certain example embodiments have been described in connection with a fixed or stationary solar cell module and a moving lens array, certain other example embodiments may involve a fixed or stationary lens array and a moving solar cell module. In the latter case, the lens array may be stationary at a fixed orientation, and the solar cell array may be configured to move during the day to maintain the focus of the light from the sun on the strip solar cells, e.g., to match the East-West movement of the sun. In this regard, the strip solar cells may be provided on a substrate as described above, and the substrate may be made to move. Such example embodiments may be used, for instance, in connection with building-integrated photovoltaic applications, similar to self-regulating windows. Self-regulating windows are known to dynamically adjust the amount of light passing therethrough, e.g., using diffusers, blinds, or the like. In certain example embodiments, the movement of the sun may be tracked (directly or indirectly, e.g., based on time of day and/or day of year) so that the substrate may be moved appropriately to increase or maximize the amount of sunlight impinging on the solar cells. It will be appreciated that diffuse light may be transmitted in such instances, and direct sunlight may be converted into electricity by the photovoltaic cells.

Certain example embodiments may be used as windows, skylights, roof-mounted PV modules, or the like in connection with BIPV applications. For example, in rooftop applications, full size solar cells may be replaced with strip cells. Thinner (e.g., 1-2 mm thick), flat or non-patterned glass may be used as cover glass in BIPV applications. To protect the strip solar cells, a UV and/or weather-resistant backsheet may be provided. For instance, Tedlar, which is commercially available from Dupont, is a PVF film that may be used as a backsheet. Of course, it will be appreciated that other materials may be used, provided that they perform functions such as, for example, vapor barrier protection, physical protection of wiring and/or other sensitive components, electrical insulation, heat reduction, etc. The strip solar cells thus may be sandwiched between a cover glass sheet and a protective backsheet. The backsheet may be transparent or opaque, depending on the desired application. In any event, the lens array may be provided in substantially parallel spaced apart relation to the strip solar cell sandwich. Known tabbing, framing, and junction box technology may be leveraged to help provide BIPV applications.

It will be appreciated from the description above that certain example applications may be structured somewhat similarly to insulating glass (IG) units. The first or outer pane may be the cylindrical lens array, whereas the second or inner pane may have the strip solar cells formed thereon. Rather than spacers, window frame components may help maintain the panes in substantially parallel, spaced apart relation to one another, e.g., at the appropriate focal length. In certain example embodiments, when the lens array has a flat surface, this side may face outwardly, e.g., towards the sun. Of course, providing patterned glass may be viewed as a desirable aesthetic feature in certain example instances, and a patterned surface may face outwardly in such cases.

The following table compares cost per watt for various types of photovoltaic technologies.

TABLE 2

Estimated Cost per Watt for Photovoltaic Technologies
Using Phoenix, Arizona as an Exemplary Location

|  | Efficiency | Tracking | Annual Power Output per m² Module Area | Cost per Watt |
|---|---|---|---|---|
| Polycrystalline silicon | 15% | None | 290 kWh | $1.40 |
| Thin film CdTe (e.g., First Solar) | 11% | None | 212 kWh | $0.98 |
| Example (e.g., Lens Array) | 20% | One-Axis East-West | 505 kWh | $0.85 |

As can be seen, the example in Table 2 produces 2.4× higher output per square meter as compared to CdTe type photovoltaic systems for direct sunlight. The example in Table 2 also provides a potentially lower cost/watt compared to CdTe type photovoltaic systems.

Figure 10:
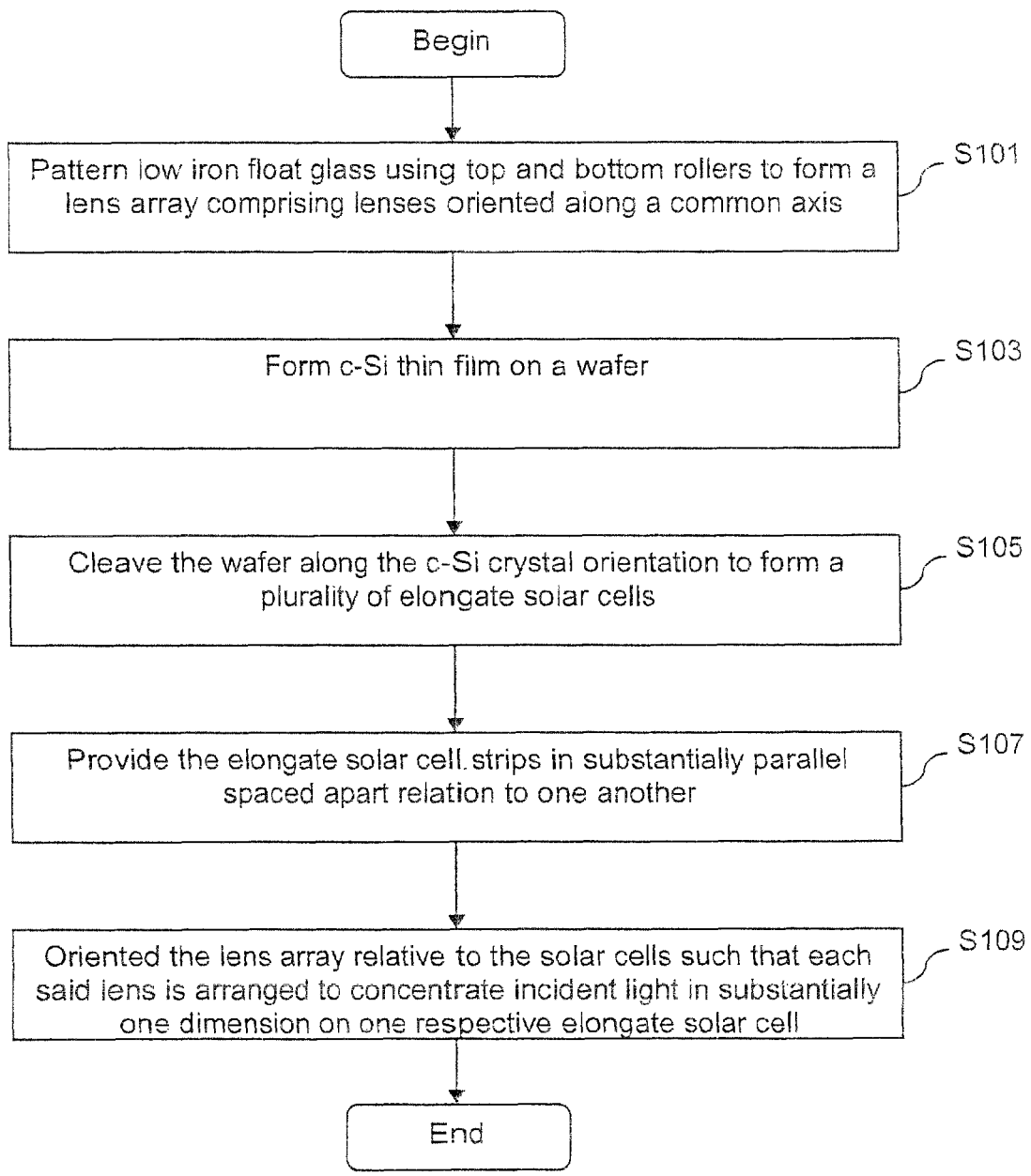
FIG. 10 is a flowchart showing an example method of making a photovoltaic system in accordance with an example embodiment.

FIG. 10 is a flowchart showing an example method of making a photovoltaic system in accordance with an example embodiment. Float glass (e.g., low iron float glass) is patterned using a plurality of top and bottom rollers to form a lens array comprising a plurality of lenses oriented along a common axis in step S101. In step S103, a c-Si thin film is formed on a wafer and, the wafer is cleaved along the c-Si crystal orientation into a plurality of elongate solar cells in step S105. The elongate solar cell strips are provided in substantially parallel spaced apart relation to one another in step S107. In step S109, the lens array is oriented relative to the solar cells such that each said lens is arranged to concentrate light incident thereon in substantially one dimension on one respective elongate solar cell. Optionally, in a step not shown, the lens array and the plurality of elongate solar cells may be mounted to a single-axis tracking system, with the single-axis tracking system being-programmed to move so as to substantially match the East-West movement of the sun, e.g., to maximize the amount of light incident on the lens array and concentrated on the strip solar cells.

As indicated above, certain example embodiments may include low-iron glass. The total amount of iron present is expressed herein in terms of $Fe_2O_3$ in accordance with standard practice. However, typically, not all iron is in the form of $Fe_2O_3$. Instead, iron is usually present in both the ferrous state ($Fe^{2+}$; expressed herein as FeO, even though all ferrous state iron in the glass may not be in the form of FeO) and the ferric state ($Fe^{3+}$). Iron in the ferrous state ($Fe^{2+}$; FeO) is a blue-green colorant, while iron in the ferric state ($Fe^{3+}$) is a yellow-green colorant. The blue-green colorant of ferrous iron ($Fe^{2+}$; FeO) is of particular concern when seeking to achieve a fairly clear or neutral colored glass, since as a strong colorant it introduces significant color into the glass. While iron in the ferric state ($Fe^{3+}$) is also a colorant, it is of less concern when seeking to achieve a glass fairly clear in color since iron in the ferric state tends to be weaker as a colorant than its ferrous state counterpart.

In certain example embodiments of this invention, a glass is made so as to be highly transmissive to visible light, to be fairly clear or neutral in color, and to consistently realize high % TS values. High % TS values are particularly desirable for photovoltaic device applications in that high % TS values of the light-incident-side glass substrate permit such photovoltaic devices to generate more electrical energy from incident radiation since more radiation is permitted to reach the semiconductor absorbing film of the device. It has been found that the use of an extremely high batch redox in the glass manufacturing process permits resulting low-ferrous glasses made via the float process to consistently realize a desirable combination of high visible transmission, substantially neutral color, and high total solar (% TS) values. Moreover, in certain example embodiments of this invention, this technique permits these desirable features to be achieved with the use of little or no cerium oxide.

In certain example embodiments of this invention, a soda-lime-silica based glass is made using the float process with an extremely high batch redox. An example batch redox which may be used in making glasses according to certain example embodiments of this invention is from about +26 to −40, more preferably from about +27 to +35, and most preferably from about +28 to +33 (note that these are extremely high batch redox values not typically used in making glass). In making the glass via the float process or the like, the high batch redox value tends to reduce or eliminate the presence of ferrous iron ($Fe^{2+}$; FeO) in the resulting glass, thereby permitting the glass to have a higher % TS transmission value which may be beneficial in photovoltaic applications. This is advantageous, for example, in that it permits high transmission, neutral color, high % TS glass to be made using raw materials having typical amounts of iron in certain example instances (e.g., from about 0.04 to 0.10% total iron). In certain example embodiments of this invention, the glass has a total iron content ($Fe_2O_3$) of no more than about 0.1%, more preferably from about 0 (or 0.04) to 0.1%, even more preferably from about 0.01 (or 0.04) to 0.08%, and most preferably from about 0.03 (or 0.04) to 0.07%. In certain example embodiments of this invention, the resulting glass may have a % FeO (ferrous iron) of from 0 to 0.0050%, more preferably from 0 to 0.0040, even more preferably from 0 to 0.0030, still more preferably from 0 to 0.0020, and most preferably from 0 to 0.0010, and possibly from 0.0005 to 0.0010 in certain example instances. In certain example embodiments, the resulting glass has a glass redox (different than hatch redox) of no greater than 0.08, more preferably no greater than 0.06, still more preferably no greater than 0.04, and even more preferably no greater than 0.03 or 0.02.

In certain example embodiments, the glass substrate may have fairly clear color that may be slightly yellowish (a positive b* value is indicative of yellowish color), in addition to high visible transmission and high % TS. For example, in certain example embodiments, the glass substrate may be characterized by a visible transmission of at least about 90% (more preferably at least about 91%), a total solar (% TS) value of at least about 90% (more preferably at least about 91%), a transmissive a* color value of from −1.0 to +1.0 (more preferably from −0.5 to +0.5, even more preferably from −0.35 to 0), and a transmissive b* color value of from −0.5 to +1.5 (more preferably from 0 to +1.0, and most preferably from +0.2 to +0.8). These properties may be realized at an example non-limiting reference glass thickness of about 4 mm.

In certain example embodiments of this invention, there is provided a method of making glass comprising:

| Ingredient | wt. % |
|---|---|
| $SiO_2$ | 67-75% |
| $Na_2O$ | 10-20% |
| CaO | 5-15% |
| total iron (expressed as $Fe_2O_3$) | 0.001 to 0.1% |
| % FeO | 0 to 0.005 | wherein the glass has visible transmission of at least about 90%, a transmissive a* color value of −1.0 to +1.0, a transmissive b* color value of from −0.50 to −1.5, % TS of at least 89.5%, and wherein the method comprises using a batch redox of from +26 to +40 in making the glass.

In certain example embodiments of this invention, there is provided a glass comprising:

| Ingredient | wt. % |
| --- | --- |
| SiO$_2$ | 67-75% |
| Na$_2$O | 10-20% |
| CaO | 5-15% |
| total iron (expressed as Fe$_2$O$_3$) | <= 0.1% |
| % FeO | <= 0.005 |
| glass redox | <= 0.08 |
| antimony oxide | 0 to less than 0.01% |
| cerium oxide | 0 to 0.07% | wherein the glass has visible transmission of at least 90%, TS transmission of at least 90%; a transmissive a* color value of −1.0 to +1.0, a transmissive b* color value of from −0.5 to +1.5.

In still further example embodiments of this invention, there is provided solar cell comprising: a glass substrate; first and second conductive layers with at least a photoelectric film provided therebetween; wherein the glass substrate is of a composition comprising:

| Ingredient | wt. % |
| --- | --- |
| SiO$_2$ | 67-75% |
| Na$_2$O | 10-20% |
| CaO | 5-15% |
| total iron (expressed as Fe$_2$O$_3$) | <= 0.1% |
| % FeO | <= 0.005 |
| glass redox | <= 0.08 |
| antimony oxide | 0 to less than 0.01% |
| cerium oxide | 0 to 0.07% | wherein the glass substrate has visible transmission of at least 90%, TS transmission of at least 90%; a transmissive a* color value of −1.0 to +1.0, a transmissive b* color value of from −0.5 to +1.5.

As used herein, the terms "on," "supported by," and the like should not be interpreted to mean that two elements are directly adjacent to one another unless explicitly stated. In other words, a first layer may be said to be "on" or "supported by" a second layer, even if there are one or more layers therebetween.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A method of making a lens array for use in a solar photovoltaic module, the method comprising:
   making glass using a float process including a float glass line; and
   patterning the glass using a plurality of rollers disposed along the float glass line so as to form a plurality of first lenses oriented along a common axis,
   wherein the rollers each have profiles such that each said first lens is patterned to have at least one convex major surface when viewed in side cross section, wherein the plurality of rollers comprise top and bottom rollers, and wherein the patterning is performed such that each said first lens has two convex major surfaces when viewed in side cross section on respective opposing major surfaces thereof so that each lens has convex surfaces on opposite sides thereof, and wherein each said lens has a focal length of about 10-200 nm.

2. The method of claim 1, wherein the lens array is a Fresnel lens array.

3. The method of claim 1, further comprising thermally tempering the lenses in the lens array.

4. The method of claim 1, further comprising wet-applying an antireflective coating to one or both major surfaces of the lens array.

5. The method of claim 1, wherein each said lens has a width of about 10-100 mm, a minimum thickness of about 2-4 mm, and a maximum thickness of about 4-8 mm.

6. The method of claim 4, wherein each said lens has a width of about 10-100 mm, a minimum thickness of about 2-4 mm, and a maximum thickness of about 4-8 mm.

* * * * *